(12) United States Patent
Carey et al.

(10) Patent No.: US 6,677,522 B1
(45) Date of Patent: Jan. 13, 2004

(54) PACKAGE FOR ELECTRONIC COMPONENT

(75) Inventors: Charles F. Carey, Endicott, NY (US); Eric A. Johnson, Greene, NY (US); Alfredo Migliore, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/255,457

(22) Filed: Sep. 26, 2002

(51) Int. Cl.[7] .............................................. H01L 23/28
(52) U.S. Cl. ...................... 174/52.2; 257/782; 257/786; 361/767; 361/808
(58) Field of Search ............................. 174/52.2, 52.3, 174/52.4; 257/678, 676, 690, 730, 778, 782, 786, 787; 264/272.11; 361/760, 767, 772, 808

(56) References Cited

U.S. PATENT DOCUMENTS

| | | | |
|---|---|---|---|
| 5,303,122 A | 4/1994 | Adams, Jr. et al. ......... | 361/767 |
| 5,659,952 A * | 8/1997 | Kovac et al. ................. | 29/840 |
| 5,663,529 A | 9/1997 | McMillan, II et al. ....... | 174/252 |
| 5,731,960 A | 3/1998 | Fung .......................... | 361/782 |
| 6,054,653 A | 4/2000 | Hansen et al. ............... | 174/261 |
| 6,147,401 A * | 11/2000 | Solberg ....................... | 257/723 |
| 6,191,360 B1 * | 2/2001 | Tao et al. .................... | 174/52.4 |
| 6,213,347 B1 | 4/2001 | Thomas ......................... | 222/52 |
| 6,228,680 B1 | 5/2001 | Thomas ....................... | 438/108 |
| 6,245,583 B1 | 6/2001 | Amador et al. ............... | 438/14 |
| 6,340,846 B1 * | 1/2002 | LoBianco et al. ........... | 257/783 |
| 6,448,635 B1 * | 9/2002 | Glenn ......................... | 257/676 |

* cited by examiner

Primary Examiner—Dean A. Reichard
Assistant Examiner—Carmelo Oliva
(74) Attorney, Agent, or Firm—John R. Pivnichny

(57) ABSTRACT

An electronic component such as a ceramic capacitor is coupled to a dielectric substrate package. Encapsulant material substantially surrounding the sides of the component, develops cracks therein, particularly near the corners of the component where CTE stresses are greatest. The cracks propagate downward into the dielectric substrate material and sever circuit lines in the substrate causing failure. A mounting pad for the component is extended from beneath the component to substantially beyond the outer periphery of the encapsulant material to prevent cracks from propagating into the dielectric material.

20 Claims, 4 Drawing Sheets

PACKAGE FOR ELECTRONIC COMPONENT

TECHNICAL FIELD

The invention relates generally to electronic component packages and particularly to those which utilize an encapsulant. Even more particularly the invention relates to substrate packages for preventing cracks within the encapsulant from severing a conductive path therein.

BACKGROUND OF THE INVENTION

Electronic component packages known in the art may include an encapsulant material. The encapsulant protects the mechanical and electronic bond between the package and the component by shielding the bond, typically solder, from the effects of dust, moisture, or contaminants in the environment which otherwise may weaken the bond or cause it to fail. The encapsulant may also provide mechanical strength to the bond, thereby reducing the effects of thermal stresses, mechanical flexing, vibration or other mechanical effects.

One such encapsulant structure and method of dispensing the encapsulant material is described in U.S. Pat. Nos. 6,228,680 6,245,583 and 6,213,347, which are hereby incorporated by reference. The encapsulant is applied to a semiconductor chip bonded in a flip-chip or "C-4" manner via solder bumps to a substrate package. The encapsulant is applied after the solder bumps are reflowed to fill the gap between the semiconductor chip and the substrate in order to strengthen the solder joints without affecting the electrical connections.

A polymeric precursor is dispensed onto the substrate adjacent the chip. The precursor is then heated, polymerized, and cured to form the encapsulant, using temperature profiles described in the above U.S. patents.

Passive components such as capacitors, resistors, diodes, switches, and the like may also be attached to mounting pads on a substrate. Proper alignment of such a component to the pad is described in U.S. Pat. Nos. 6,054,653 and 5,663,529.

For example, Hansen et al. In U.S. Pat. No. 6,054,653 describes a pad shape with at least two triangular portions to prevent the tendency of a surface mount component to move about or float and become misaligned when solder is melted to attach the surface mount component to a pad. The triangular portions are sized to provide a solder fillet formation to reliably attach the component to the pad.

McMillan II et al. in U.S. Pat. No. 5,663,529 describe a substrate pad having notches for defining registration edges. The registration edges along with surface tension forces produced by melting solder provide proper alignment of a heatsink component to the pad during reflow soldering. The mounting pad may be enlarged, except for the notches, to increase thermal transfer from the heatsink into a printed circuit board beneath the mounting pad.

Adams, Jr. et al. in U.S. Pat. No. 5,303,122 describe a mounting pad shape upon which different sized surface mount components can be mounted. Fing in U.S. Pat. No. 5,731,960 describe a low inductance decoupling capacitor arrangement in which a pad has a mounting region and a boundary region. The boundary region has low inductance via connections. A solder mask material is applied over the boundary region to prevent solder from being sucked into the vias and permitting the capacitor component to be aligned in the mounting region which is not solder masked.

When an encapsulant material is used with a surface mounted component for any purpose including those above, there may be a coefficient of thermal expansion (CTE) difference between the encapsulant and the component. This difference is especially severe with organic encapsulant materials applied to ceramic components mounted on organic substrates. The low CTE of surface mounted, ceramic capacitors, for example, creates high stress in an encapsulant filled, particularly at the corners of the ceramic component and cracking of the encapsulant there is common. Such a crack can then propagate into the dielectric substrate below, just beyond the component periphery causing cracks in underlying circuit lines within the substrate. These cracks may sever the electrical continuity of the line or produce an unreliable connection subject to failure under normal thermal or mechanical stresses.

Organic substrates with thin organic layers having thin narrow circuit lines are particularly susceptible to failure from crack propagation because the thin layers and lines have little strength to resist a crack originating in the encapsulant, which otherwise might not cause a failure.

None of the aforementioned documents provide a recognition of this cracking problem or offer a solution thereto. It is believed that a solution to this now identified problem would constitute a significant advancement in the component packaging art.

OBJECTS AND SUMMARY OF THE INVENTION

It is therefore a principal object of the present invention to enhance the electronic component packaging art by providing a package with enhanced resistance to crack porpagation.

It is another object to provide such a package wherein enhanced resistance to crack propagation is possible.

It is a further object to provide such a package which can be produced in a relatively inexpensive manner and is particularly adapted for mass production.

These and other objects are attained in accordance with one embodiment of the invention wherein there is provided an electronic package, comprising a substrate of dielectric material having at least one conductive path therein, a conductive pad on an outer surface of the substrate, having an electronic component coupled thereto, a quantity of encapsulant material substantially surrounding the electronic component along the sides thereof, and wherein the conductive pad extends from substantially beneath the electronic component to beyond the outer periphery of the encapsulant material to substantially prevent cracks within the encapsulant material from spreading into the dielectric material and severing the conductive path.

In accordance with another embodiment of the invention there is provided a component packaging structure, comprising, a dielectric substrate having a conductive path therein, a metallic component mounting pad on an outer surface of the dielectric substrate, having an electronic component attached thereto, encapsulant material positioned along a side of the electronic component, and wherein said mounting pad extends outward from the side of the electronic component substantially beyond the encapsulant material to substantially prevent a crack within the encapsulant material from propagating into the dielectric substrate and opening the conductive path.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
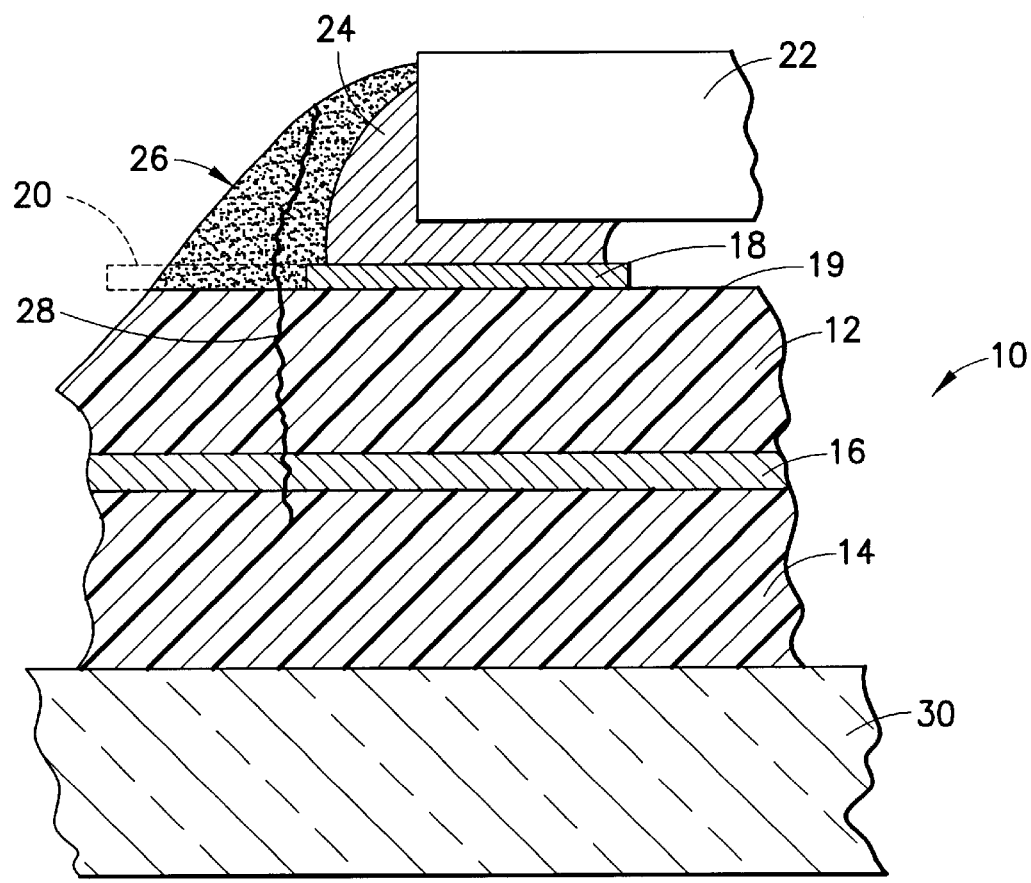
FIG. 1 illustrates a cross sectional view of a crack in an encapsulant propagating into a substrate below, severing a conductive path.

In FIG. 1 there is shown, in cross section, substrate 10 having one or more dielectric or insulative layers 12, 14. Any type of dielectric or electrically insulative material may be used including, but not limited to polyimide, ceramic, epoxy, glass, mica and combinations thereof. Substrate 10 may optionally be attached to a heatsink, supporting structure, or second substrate 30.

Conductive path 16 within substrate 10 may be any electrically conductive material capable of distributing an electrical voltage or current from one location to another within substrate 10. The electrical voltage or current would typically represent a digital signal level being communicated between electrical circuits, but could also represent an analog signal, power or ground connection. Any type of electrically conductive material may be used including but not limited to copper, aluminum, silver, tin gold, carbon, nickel, or conductive organic material. The conductive path may be a signal line, conductive connection or other type of conductor known in the packaging art. It may be formed by etching, electroless or electro plating, paste screening, sputtering, lamination or other packaging processes.

Conductive pad 18 on outer surface 19 of substrate 10 may also be any type of electrically conductive material. Electronic component 22 coupled to pad 18, may be any type of electronic component and associated package including a ceramic, tantalum, polyimide or mica capacitor, a resistor, a potentiomente, a diode, a semiconductor integrated circuit or chip, or part of a component such as a heatsink, or mounting tab.

Solder 24 or other conductive binders such as conductive epoxy material may be used to couple component 22 to pad 18.

A quantity of encapsulant material 26 substantially surrounds the sides of component 22. Encapsulant material 26 may also fill any open space or gap between component 22 and substrate 10 (not shown). A no flow encapsulant material such as Kester Se-cure 9101, manufactured by Litton Kester Company of Des Plaines, Ill. may be used, in which case the encapsulant material may be first applied to substrate 10 prior to coupling component 22 by reflow soldering.

Post chip-join encapsulants such as Namics Chipcoat U8437-2, manufactured by Namics Corporation of Niigata City, Japan may also be used. These are normally applied after reflow solder coupling component 22 to pad 18.

Crack 28 may appear in encapsulant 26 due to thermal or mechanical stresses, particularly thermal cycling stresses due to a differning CTE between component 22 and encapsulant material 26. These stresses are typically greatest at the corners of component 22. Cracks 52 are clearly shown in the encapsulant at all four corners of FIG. 3 as described below.

Although crack 28 originates in encapsuant material 26, it may propagate downward causing a crack in layers 12 and 14 of substrate 10. Crack propagation is more likely when layers 12 and 14 are a thin organic dielectric material as is common in high density component packages.

Crack 28 may also propagate into and through conductive path 16 severing it. Crack 28 may open the connection preventing distribution of an electrical voltage or current. Crack 28 may also cause a partial or intermittent open connection leading to unreliable communication of a signal through conductive path 16.

Figure 2:
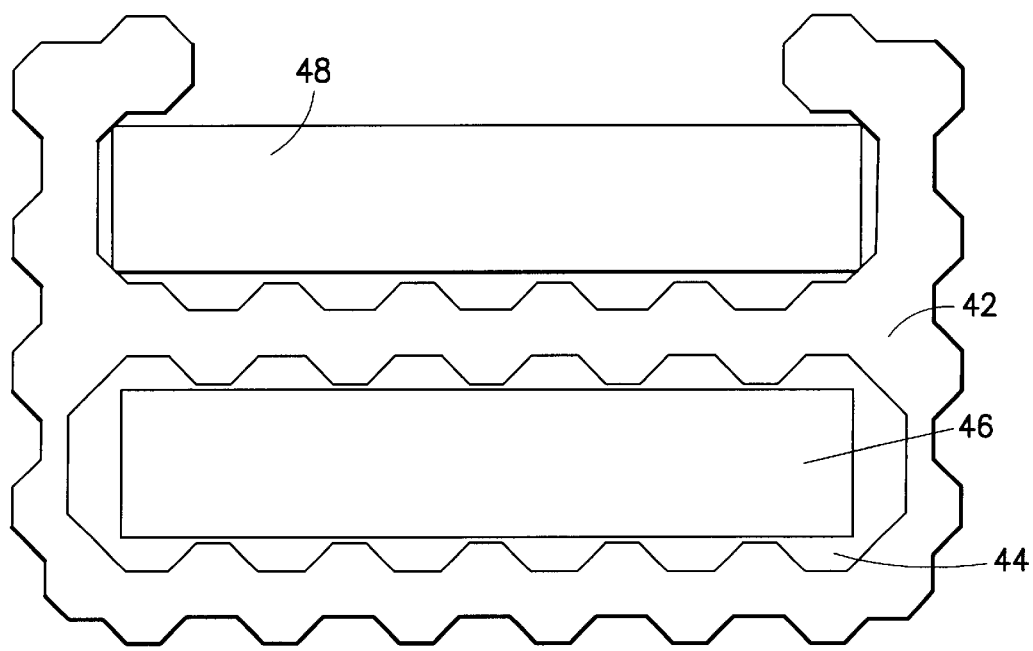
FIG. 2 is a prior art pad layout.

In FIG. 2 there is shown a prior art mounting pad layout for an electronic component such as a surface mount capacitor or resistor having two terminals. For example a ground plane may have rectangular area 48 adapted to accept solder material. Dielectric material 42 insulates voltage pad 44, having solder area 46, from the ground plane. A solder mask permits solder to be applied only to areas 48 and 46. The solder mask may be Taiyo PSR4000, available from Taiyo America, Inc. of Carson City, Nev. A two terminal component, e.g. a ceramic decoupling capacitor, is then reflow coupled to ground and voltage areas 48 and 46 respectively.

Figure 3:
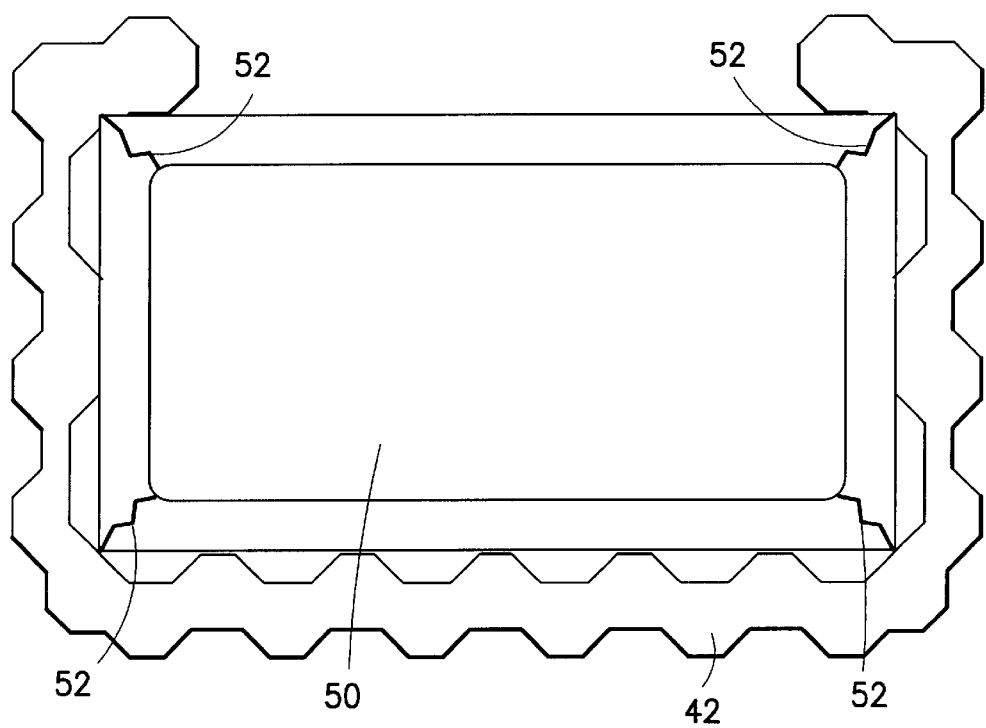
FIG. 3 illustrates cracks in an encapsulant in the four corner regions of a component.

FIG. 3 shows a top view of such a capacitor 50 attached to such a mounting pad layout. Encapsulant material surrounding capacitor 50 has cracks 52 in all four corner areas where as previously noted stresses are highest. Typically cracks will start in the encapsulant material, extend beyond the conductive pad, then down into the dielectric material.

Figure 4:
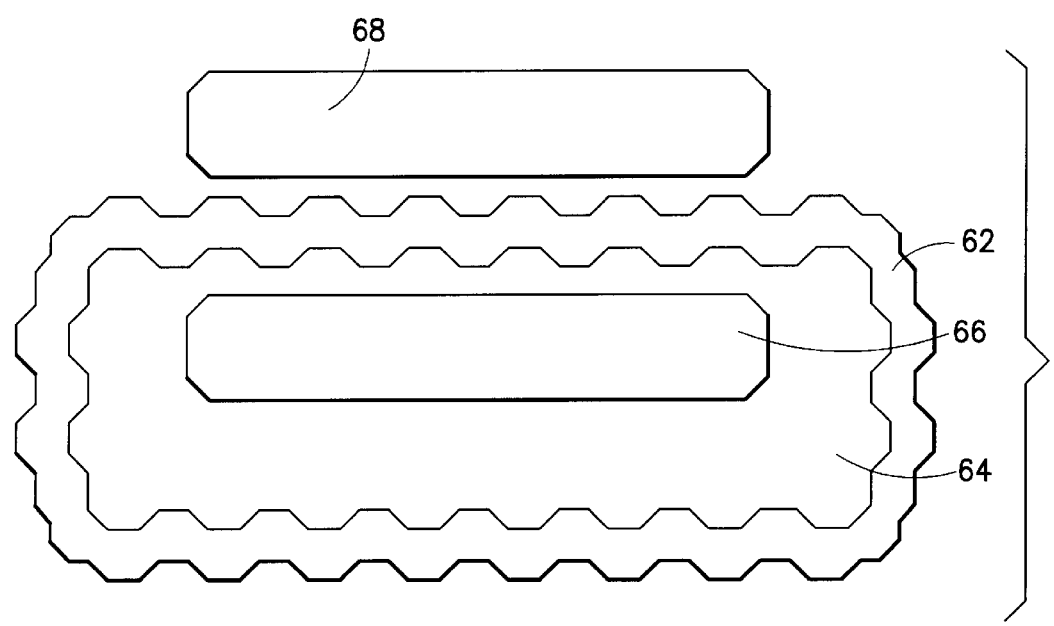
FIG. 4 is a mounting pad layout in accordance with the resent invention.

Conductive pad 18 may be extended 20 as shown in FIG. 1 from substantially beneath electrical component 22 to beyond the outer periphery of encapsulant material 26. Pad 18 may have a rectangular shape, or a rectangle with rounded corners, or any other convex shape. Pad 18 may also have an irregular perimeter as shown in FIG. 4. An irregular shape is known to reduce stresses over a long straight section of perimeter.

FIG. 4 shows a mounting pad layout having voltage pad 64 so extended. Dielectric material 62 may have signal lines or other conductive paths (not shown) below therein and below pad 64. Solder mask permits solder to be applied only on ground 68 and voltage 66 solder areas respectively. A ceramic capacitor may be reflow soldered to the mounting pad layout of FIG. 4. A quantity of encapsulant material may also be substantially surrounding along the sides of the ceramic capacitor. Conductive pad 18 extends about 0.020 inch beyond the encapsulant material.

Such extension of conductive pad 18 has been found to effectively prevent propagation of crack 28 into the dielectric material of substrate 10. For example, if pad 18 is copper of one ounce per square foot thickness, then the fatigue resistance of this copper will be much greater than many organic materials typically use for dielectric layers 12, 14. Crack 28 is therefore prevented from severing conductive path 16 or opening or partially opening such a conductive connection.

Cracks 52 will form in the encapsulant material in the corner areas as shown in FIG. 3, however, extended pad 64 prevents cracks 52 from severing any signal lines or conductive paths in dielectric material 62.

While there have been shown and described what are at present considered the preferred embodiments of the invention, it will be obvious to those skilled in the art that various changes and modification may be made therein without departing from the scope of the invention as defined by the appended claims.

What is claimed is:

1. An electronic package, comprising:
    a substrate of dielectric material having at least one conductive path therein;
    a conductive pad on an outer surface of said substrate, having an electronic component coupled thereto;
    a quantity of encapsulant material substantially surrounding said electronic component along the sides thereof; and
    wherein said conductive pad extends from substantially beneath said electronic component to beyond the outer periphery of said encapsulant material to substantially prevent cracks within said encapsulant material from spreading into said dielectric material and severing said conductive path.

2. The electronic package of claim 1 wherein said dielectric material is a photoimagable dielectric material.

3. The electronic package of claim 1, wherein said conductive path comprises a copper conductor.

4. The electronic package of claim 1, wherein said conductive pad comprises copper.

5. The electronic package of claim 1, wherein said electronic component is coupled with solder.

6. The electronic package of claim 1, wherein said electronic component comprises a ceramic capacitor.

7. The electronic package of claim 1, wherein said encapsulant material is a no flow encapsulant.

8. The electronic package of claim 1, wherein said encapsulant material is a post chip-join encapsulant.

9. A component packaging structure, comprising:
    a dielectric substrate having a conductive path therein;
    a metallic component mounting pad on an outer surface of said dielectric substrate, having an electronic component attached thereto; encapsulant material positioned along a side of said electronic component; and
    wherein said mounting pad extends outward from said side of said electronic component substantially beyond said encapsulant material to substantially prevent a crack within said encapsulant material from propagating into said dielectric substrate and opening said conductive path.

10. The component packaging structure of claim 9, wherein said conductive path is a copper line.

11. The component packaging structure of claim 9, wherein said electronic component is a ceramic capacitor.

12. The component packaging structure of claim 9, wherein said electronic component comprises a ceramic material.

13. The component packaging structure of claim 9, wherein said electronic component is attached with solder.

14. A component package, comprising:
    an insulative substrate having a conductive connection therein;
    a conductive pad on an outer surface of said substrate, having an electronic component bonded thereto;
    a quantity of encapsulant material disposed around the periphery of said electronic component; and
    wherein said conductive pad extends from beneath said electronic component to beyond the outer periphery of said encapsulant material to prevent cracks within said encapsulant material from spreading into said substrate and severing said conductive connection.

15. The component package of claim 14, wherein said conductive connection is plated copper.

16. The component package of claim 15, wherein said plated copper is electroless plated copper.

17. The component package of claim 14, wherein said conductive pad has a convex outer periphery.

18. The component package of claim 14, wherein said electronic component is a semiconductor chip.

19. The component package of claim 14, wherein said electronic component is a ceramic component.

20. The component package of claim 19, wherein said ceramic component is bonded with a solder material.

* * * * *